United States Patent
Nagase et al.

(10) Patent No.: US 8,953,369 B2
(45) Date of Patent: Feb. 10, 2015

(54) MAGNETORESISTIVE ELEMENT AND MAGNETIC MEMORY USING THE SAME

(71) Applicant: Kabushiki Kaisha Toshiba, Tokyo (JP)

(72) Inventors: Toshihiko Nagase, Yokohama (JP); Eiji Kitagawa, Yokohama (JP); Katsuya Nishiyama, Yokohama (JP); Tadashi Kai, Tokyo (JP); Koji Ueda, Kamakura (JP); Daisuke Watanabe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/159,057

(22) Filed: Jan. 20, 2014

(65) Prior Publication Data

US 2014/0131823 A1 May 15, 2014

Related U.S. Application Data

(63) Continuation of application No. 13/427,732, filed on Mar. 22, 2012, now Pat. No. 8,670,268.

(30) Foreign Application Priority Data

Jul. 4, 2011 (JP) ................................. 2011-148445

(51) Int. Cl.
*G11C 11/00* (2006.01)
*G11C 11/14* (2006.01)
(Continued)

(52) U.S. Cl.
CPC ................ *H01L 43/02* (2013.01); *H01L 43/08* (2013.01); *H01L 43/10* (2013.01); *G11C 11/161* (2013.01); *H01F 10/3272* (2013.01); *H01F 10/3286* (2013.01)

USPC ........... 365/158; 365/171; 365/173; 257/421; 257/E29.323; 257/E43.005

(58) Field of Classification Search
USPC ......................................... 365/158
See application file for complete search history.

(56) References Cited

U.S. PATENT DOCUMENTS 6,816,347 B2 * 11/2004 Koi et al. ................. 360/324.11
7,663,197 B2    2/2010 Nagase et al.
(Continued)

FOREIGN PATENT DOCUMENTS

JP    2002-124716 A    4/2002
JP    2008-109118      5/2008
(Continued)

OTHER PUBLICATIONS

U.S. Appl. No. 13/049,806, filed Mar. 16, 2011, Yamakawa.
(Continued)

*Primary Examiner* — Son Mai
(74) *Attorney, Agent, or Firm* — Knobbe Martens Olson & Bear LLP

(57) ABSTRACT

According to one embodiment, a magnetoresistive element includes first and second magnetic layers and a first nonmagnetic layer. The first magnetic layer has an axis of easy magnetization perpendicular to a film plane, and a variable magnetization. The second magnetic layer has an axis of easy magnetization perpendicular to a film plane, and an invariable magnetization. The first nonmagnetic layer is provided between the first and second magnetic layers. The second magnetic layer includes third and fourth magnetic layers, and a second nonmagnetic layer formed between the third and fourth magnetic layers. The third magnetic layer is in contact with the first nonmagnetic layer and includes Co and at least one of Zr, Nb, Mo, Hf, Ta, and W.

18 Claims, 10 Drawing Sheets

(51) Int. Cl.
*G11C 11/15* (2006.01)
*H01L 29/82* (2006.01)
*H01L 43/02* (2006.01)
*H01L 43/08* (2006.01)
*H01L 43/10* (2006.01)
*G11C 11/16* (2006.01)
*H01F 10/32* (2006.01)

(56) References Cited

U.S. PATENT DOCUMENTS

| | | | |
|---|---|---|---|
| 7,768,824 B2 | 8/2010 | Yoshikawa et al. | |
| 7,924,607 B2 | 4/2011 | Yoshikawa et al. | |
| 8,036,025 B2 | 10/2011 | Nagase et al. | |
| 8,098,514 B2 | 1/2012 | Nagase et al. | |
| 8,299,552 B2 | 10/2012 | Nagase et al. | |
| 8,305,801 B2 | 11/2012 | Daibou et al. | |
| 8,659,103 B2 * | 2/2014 | Watanabe et al. | 257/421 |
| 2002/0044479 A1 | 4/2002 | Ikeda | |
| 2006/0114714 A1 | 6/2006 | Kanegae | |
| 2007/0206333 A1 | 9/2007 | Watanabe et al. | |
| 2008/0231998 A1 | 9/2008 | Yoshikawa et al. | |
| 2008/0253174 A1 | 10/2008 | Yoshikawa et al. | |
| 2009/0080238 A1 | 3/2009 | Yoshikawa et al. | |
| 2009/0080239 A1 | 3/2009 | Nagase et al. | |
| 2009/0141410 A1 | 6/2009 | Jogo et al. | |
| 2010/0230770 A1 | 9/2010 | Yoshikawa et al. | |
| 2011/0007560 A1 | 1/2011 | Dieny et al. | |
| 2011/0116305 A1 | 5/2011 | Nagamine et al. | |
| 2011/0211389 A1 | 9/2011 | Yoshikawa et al. | |
| 2011/0222335 A1 | 9/2011 | Yoshikawa et al. | |
| 2012/0008381 A1 | 1/2012 | Nagase et al. | |
| 2012/0068284 A1 | 3/2012 | Kitagawa et al. | |
| 2012/0068285 A1 | 3/2012 | Kitagawa et al. | |
| 2012/0069640 A1 | 3/2012 | Nagase et al. | |
| 2012/0088125 A1 | 4/2012 | Nishiyama et al. | |
| 2012/0099369 A1 | 4/2012 | Kai et al. | |
| 2012/0217476 A1 | 8/2012 | Ikeno et al. | |
| 2012/0241881 A1 | 9/2012 | Daibou et al. | |
| 2012/0243305 A1 | 9/2012 | Nakayama et al. | |
| 2013/0001713 A1 | 1/2013 | Ueda et al. | |
| 2013/0001714 A1 | 1/2013 | Nishiyama et al. | |
| 2013/0009259 A1 * | 1/2013 | Watanabe et al. | 257/421 |

FOREIGN PATENT DOCUMENTS

| | | |
|---|---|---|
| JP | 2008-252018 A | 10/2008 |
| JP | 2009-081216 A | 4/2009 |
| JP | 2009-081315 A | 4/2009 |
| JP | 2009-239052 A | 10/2009 |
| JP | 2010-010720 A | 1/2010 |
| JP | 2010-016408 A | 1/2010 |
| JP | 2010-232499 A | 10/2010 |
| WO | WO 2011/036795 | 3/2011 |

OTHER PUBLICATIONS

U.S. Appl. No. 13/233,906, filed Sep. 15, 2011, Nagase.
U.S. Appl. No. 13/407,630, filed Feb. 28, 2012, Ikeno et al.
U.S. Appl. No. 13/424,136, filed Mar. 19, 2012, Watanabe et al.
U.S. Appl. No. 13/427,732, filed Mar. 22, 2012, Nagase.
U.S. Appl. No. 13/432,626, filed Mar. 28, 2012, Nakayama.
U.S. Appl. No. 14/147,903, filed Jan. 6, 2014, Ikeno et al.
Worledge et al., "Spin Torque Switching of Perpendicular Ta/CoFeB/MgO-Based Magnetic Tunnel Junctions", Applied Physics Letters 98, 022501 (2011).
Ikeda et al. "A Perpedicular-Anisotrophy CoFeB-MgO Magnetic Tunnel Junction", Nature Materials, 2804 pp. 1-3 Jul. 2010.
Background Art Information, Toshiba, Dec. 8, 2011.
Background Art Information (Concise Explanation for JP 2009-081216), Toshiba, Jan. 19, 2011.
Japanese Office Action dated Oct. 14, 2014 for JP Application No. 2011-148445 filed Jul. 4, 2011.

* cited by examiner

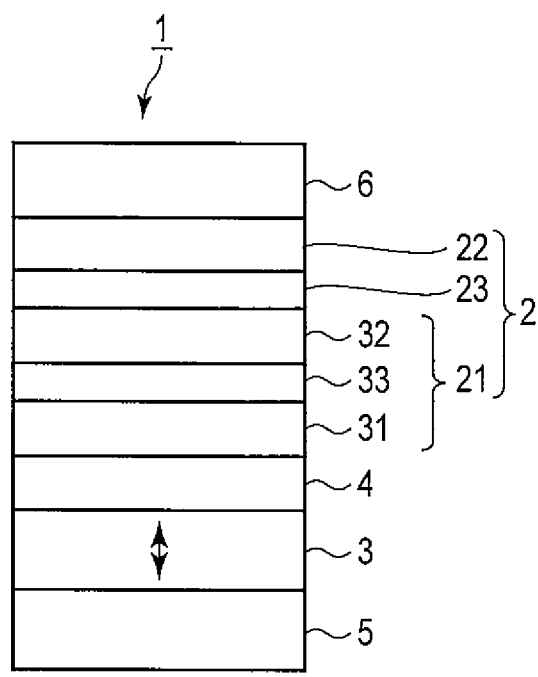
F I G. 1
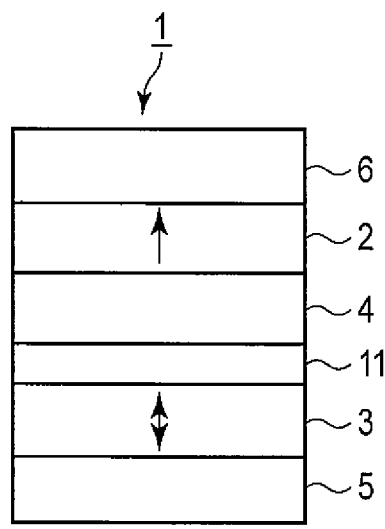
F I G. 2

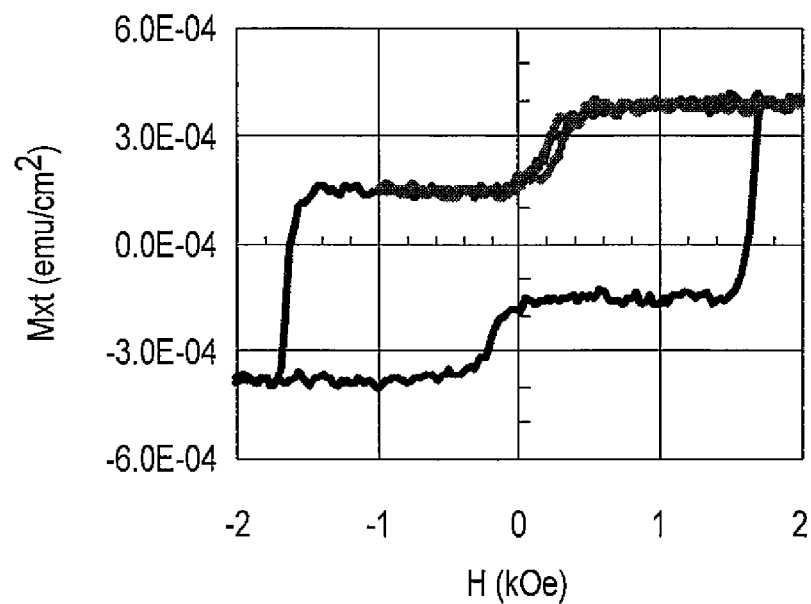
F I G. 4
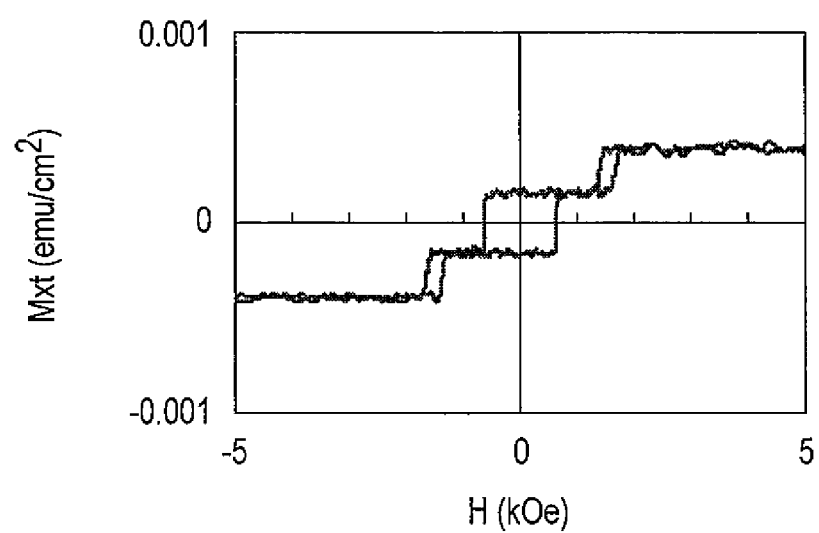
F I G. 5

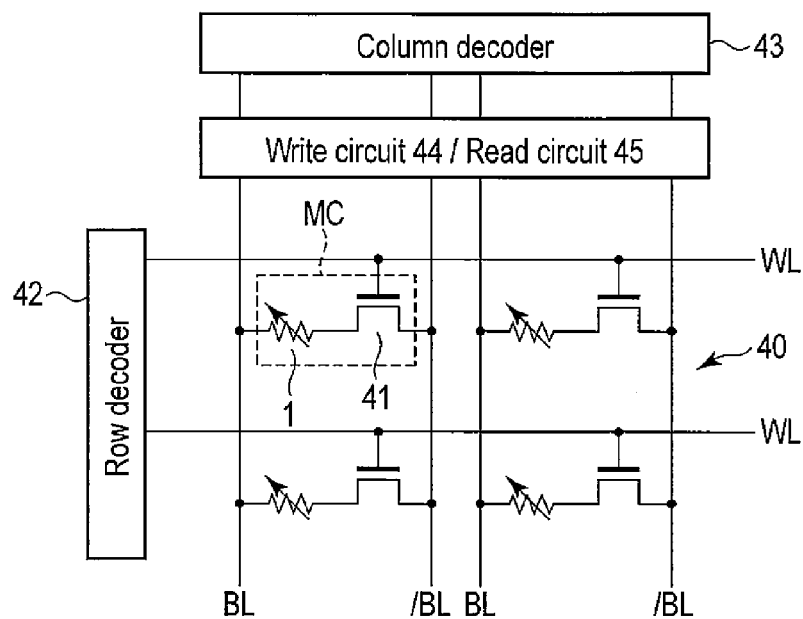
F I G. 6
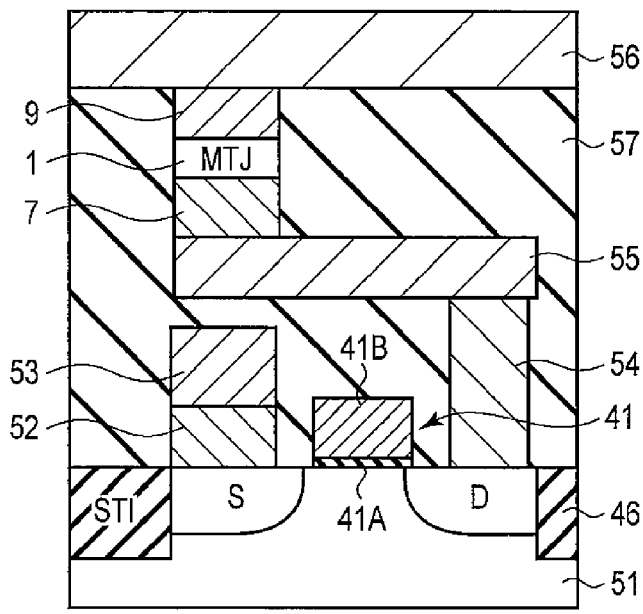
F I G. 7

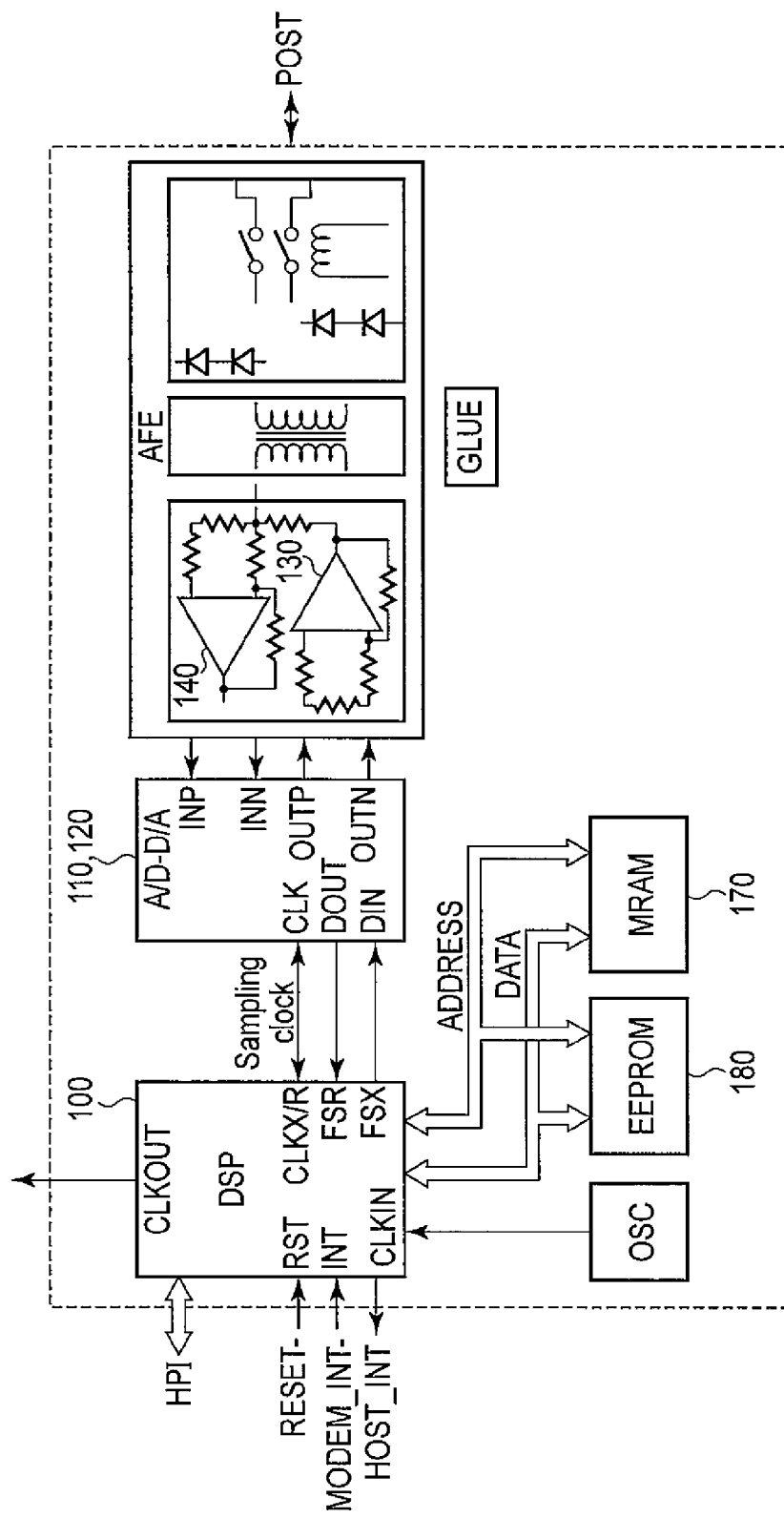
F I G. 8

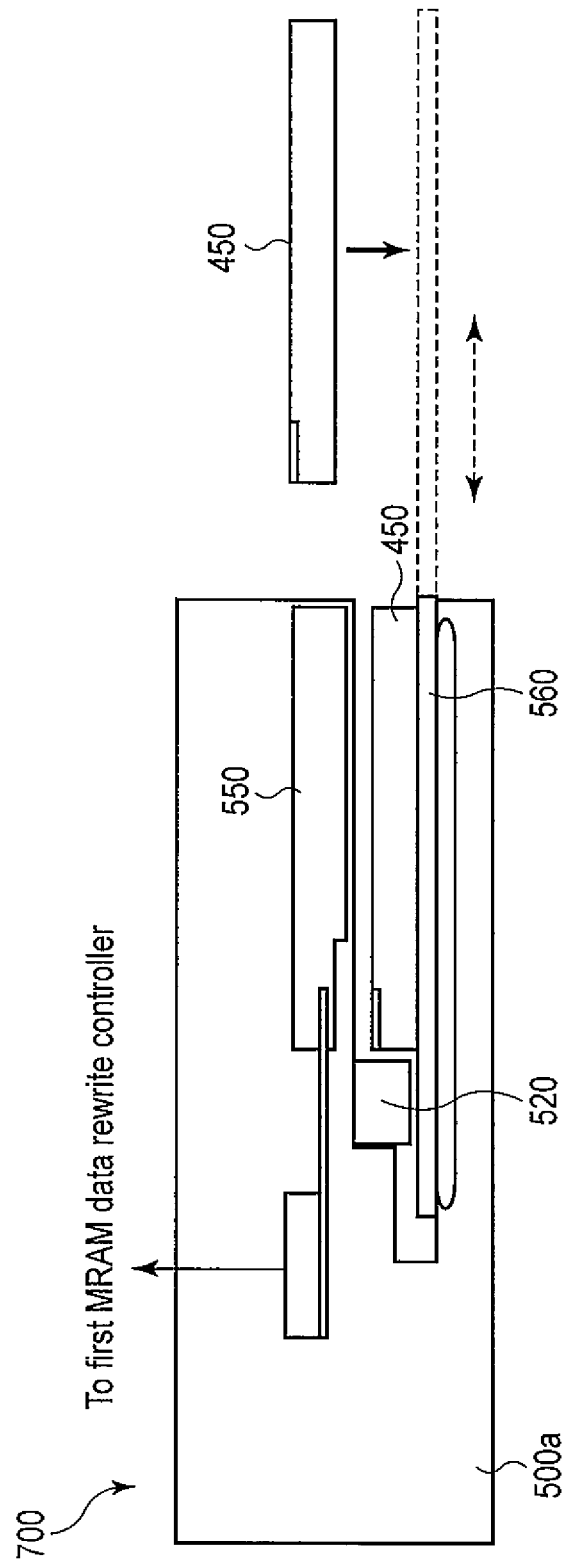
F I G. 14

MAGNETORESISTIVE ELEMENT AND MAGNETIC MEMORY USING THE SAME

CROSS-REFERENCE TO RELATED APPLICATIONS

This application is a continuation of U.S. patent application Ser. No. 13/427,732, filed Mar. 22, 2012, which is based upon and claims the benefit of priority from prior Japanese Patent Application No. 2011-148445, filed Jul. 4, 2011, the entire contents of each of which are incorporated herein by reference.

FIELD

Embodiments described herein relate generally to a magnetoresistive element and a magnetic memory using the magnetoresistive element.

BACKGROUND

A magnetoresistive element having a ferromagnetic tunnel junction is also called a magnetic tunnel junction (MTJ) element, and a write method (spin transfer torque writing method) using the spin-momentum-transfer (SMT) has been proposed as a write method of the MTJ element.

There is a method of using a so-called perpendicular magnetization film having the axis of easy magnetization in a direction perpendicular to the film plane as a ferromagnetic material forming the magnetoresistive element. When using magnetocrystalline anisotropy in a perpendicular magnetization arrangement, the element size can be made smaller than that of an in-plane magnetization structure because no shape magnetic anisotropy is used. In addition, dispersion in the direction of easy magnetization can be decreased. By using a material having large perpendicular magnetocrystalline anisotropy, therefore, it is expected to realize both smaller element size and lower switching current while maintaining the thermal stability.

The perpendicular magnetization arrangement has the problem that a large strayed magnetic field is generated as small size progresses. A strayed magnetic field from a fixed layer (reference layer) shifts a switching field in a storage layer in a direction in which a parallel arrangement is stable, thereby increasing a switching current. To avoid this problem, a magnetic layer (shift cancelling layer) having a magnetization direction antiparallel to that in the fixed layer must be added to cancel the strayed magnetic field from the fixed layer.

If a large strayed magnetic field is generated as small size progresses, it becomes difficult for the shift cancelling layer to adjust the strayed magnetic field from the fixed layer. Accordingly, it is necessary to perform adjustment so as to decrease the saturation magnetization and film thickness of the fixed layer, and adjust the structure so as to increase the saturation magnetization of the shift cancelling layer.

BRIEF DESCRIPTION OF THE DRAWINGS

FIG. 1 is a sectional view of a magnetoresistive element of a first embodiment;

FIG. 2 is a sectional view of a magnetoresistive element of a first modification according to the first embodiment;

FIG. 4 is a graph showing a hysteresis loop when the Ru film thickness is 0.6 nm in the first embodiment;

FIG. 5 is a graph showing the hysteresis loop of an element having a pseudo bottom-pinned structure according to the first embodiment;

FIG. 6 is a circuit diagram showing the arrangement of an MRAM of a second embodiment;

FIG. 7 is a sectional view of a memory cell in the MRAM of the second embodiment;

FIG. 8 is a block diagram showing a DSL data path unit of a DSL modem as an application example;

FIG. 14 is a sectional view showing a sliding type transfer apparatus as an application example.

DETAILED DESCRIPTION

Figure 3A:
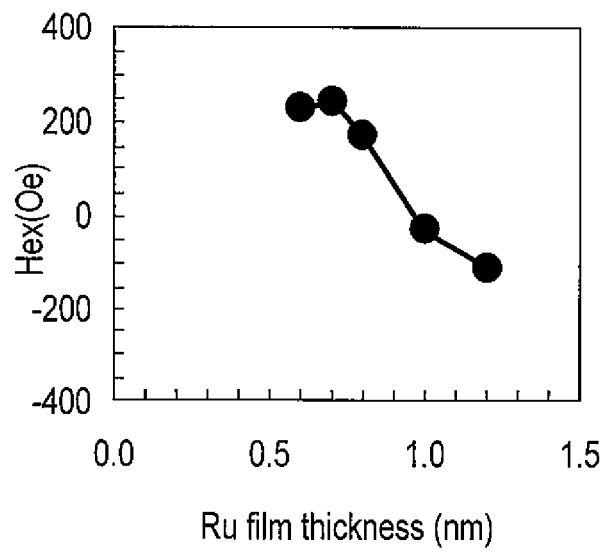
FIGS. 3A and 3B are a graph showing the dependence on the Ru film thickness of an element having a pseudo top-pinned structure according to the first embodiment.

In the following explanation, the same reference numerals denote constituent elements having almost the same functions and arrangements, and a repetitive explanation will be made only when necessary. However, it should be noted that the drawings are exemplary views, so the relationship between the thickness and the planar dimension, the ratio of the thickness of each layer, and the like are different from actual ones. Accordingly, practical thicknesses and dimensions should be judged by referring to the following explanation. Also, the individual drawings of course include portions having different dimensional relationships and different ratios.

Note also that each embodiment to be explained below exemplarily discloses an apparatus and/or method for embodying the technical idea of the present invention, and the technical idea of the present invention does not specify the materials, shapes, structures, layouts, and the like of components to those described below. The technical idea of the present invention can variously be changed within the scope of the appended claims.

In general, according to one embodiment, a magnetoresistive element includes a first magnetic layer, a second magnetic layer and a first nonmagnetic layer. The first magnetic layer has an axis of easy magnetization perpendicular to a film plane, and a variable magnetization direction. The second magnetic layer has an axis of easy magnetization perpendicular to a film plane, and an invariable magnetization direction. The first nonmagnetic layer is provided between the first magnetic layer and the second magnetic layer. The second magnetic layer includes a third magnetic layer, a fourth magnetic layer, and a second nonmagnetic layer formed between the third magnetic layer and the fourth magnetic layer. The third magnetic layer is in contact with the first nonmagnetic layer and includes Co and at least one of Zr, Nb, Mo, Hf, Ta, and W.

First Embodiment

The first embodiment is directed to a magnetoresistive element.

(1) Structure of Magnetoresistive Element

FIG. 1 is a sectional view of the magnetoresistive element of the first embodiment.

Referring to FIG. 1, each arrow indicates a magnetization direction. A magnetoresistive element mentioned in this specification and the appended claims means a tunneling magnetoresistive effect (TMR) element using a semiconductor or insulator as a spacer layer. Also, the following drawings show the main parts of the magnetoresistive element, but other layers may also be included as long as the arrangements shown in the drawings are included.

A magnetoresistive element 1 writes information by the spin transfer torque magnetization reversal method. That is, in accordance with the direction of a spin polarization current supplied to each layer in a direction perpendicular to the film plane, the relative angle of magnetization between a storage layer and fixed layer is made to correspond to binary information "0" or "1" by changing the angle into a parallel or antiparallel state (i.e., the minimal or maximal of the resistance), thereby storing information.

As shown in FIG. 1, the magnetoresistive element 1 includes at least two magnetic layers 2 and 3, and a nonmagnetic layer 4 formed between the magnetic layers 2 and 3. The magnetic layer 3 has the axis of easy magnetization in the direction perpendicular to the film plane, and the magnetization direction rotates. The magnetic layer 3 will be called a storage layer (a free layer, magnetization free layer, magnetization variable layer, or recording layer) hereinafter. The properties of the storage layer 3 will be described in detail later. Magnetization in the direction perpendicular to the film plane will be called perpendicular magnetization hereinafter.

The magnetic layer 2 has the axis of easy magnetization in the direction perpendicular to the film plane, and the magnetization direction is invariable. The magnetic layer 2 will be called a fixed layer (a magnetization fixed layer, reference layer, magnetization reference layer, pinned layer, standard layer, or magnetization standard layer) hereinafter.

The fixed layer (magnetic layer) 2 includes magnetic layers 21 and 22, and a nonmagnetic layer 23 formed between the magnetic layers 21 and 22. The magnetic layers 21 and 22 have antiparallel magnetization directions with the nonmagnetic layer 23 being sandwiched between them. Also, the magnetic layer 21 includes two ferromagnetic layers, i.e., a first ferromagnetic material 31 and second ferromagnetic material 32, and a first nonmagnetic material 33 formed between the first ferromagnetic material 31 and second ferromagnetic material 32. The first ferromagnetic material 31 and second ferromagnetic material 32 have parallel magnetization directions with the first nonmagnetic material 33 being sandwiched between them. The total film thickness of the first ferromagnetic material 31, second ferromagnetic material 32, and first nonmagnetic material 33 is desirably 5 nm or less.

The properties of the fixed layer 2 will be described in detail later. Note that the magnetization direction in the fixed layer 2 may point either in the opposite direction to the substrate (upward) or in the direction to the substrate (downward).

The nonmagnetic layer (tunnel barrier layer) 4 is made of an insulating film such as an oxide. The properties of the nonmagnetic layer 4 will be described in more detail later.

The magnetoresistive element 1 is a magnetoresistive element for use in the spin-transfer-torque writing method. That is, when writing information, an electric current is supplied from the fixed layer 2 to the storage layer 3, or from the storage layer 3 to the fixed layer 2, in the direction perpendicular to the film plane, thereby injecting electrons in which spin information is accumulated, into the storage layer 3 from the fixed layer 2.

The spin angular momentum of the injected electrons is transferred to electrons in the storage layer 3 in accordance with the spin angular momentum conservation law, thereby switching the magnetization of the storage layer 3. That is, the magnetization direction of the storage layer 3 changes in accordance with an electric current bi-directionally flowing through the storage layer 3, nonmagnetic layer 4, and fixed layer 2.

FIG. 1 shows a so-called, top-pinned structure (bottom-free structure) in which the storage layer 3 is formed on an underlying layer 5, and the fixed layer 2 is formed on the nonmagnetic layer 4.

The underlying layer 5 may also be formed below the storage layer 3. The underlying layer 5 is used to control the crystallinity such as the crystal orientation and crystal grain size of each layer above the storage layer 3. An unshown substrate (e.g., a silicon semiconductor substrate) exists below the underlying layer 5. Details of the properties of the storage layer 3 will be described later.

A cap layer 6 may also be formed on the fixed layer 2. The cap layer 6 mainly functions as a protective layer, e.g., prevents the oxidation of the magnetic layer.

The magnetic layer 21 forming the fixed layer 2 has a multilayered structure including the first ferromagnetic material 31, second ferromagnetic material 32, and first nonmagnetic material 33, and has perpendicular magnetic anisotropy. To achieve perpendicular magnetic anisotropy, the first ferromagnetic material 31 is a CoFe alloy or an alloy $(Co_{100-x}-Fe_x)_{100-y}B_y$ containing Co, Fe, and B where $x \geq 50$ at % and $0 < y \leq 30$ at %, and the first nonmagnetic material 33 is an element selected from Zr, Nb, Mo, Hf, Ta, or W, or an alloy mainly containing at least the element. The ferromagnetic material 32 desirably contains Co as a main component in order to couple with the magnetic layer 22 by exchange coupling via the nonmagnetic layer 23.

The nonmagnetic layer 23 desirably contains Ru, and the film thickness is desirably 0.4 (inclusive) to 1.0 (inclusive) nm. The magnetic layer 22 need only contain a general material system having perpendicular magnetic anisotropy. However, it is necessary to appropriately adjust the saturation magnetization and film thickness of the magnetic layer 22 so as to be able to cancel the shift of the switching magnetic field in the storage layer by a strayed magnetic field from the magnetic layer 21 having the multilayered structure including the first ferromagnetic material 31, second ferromagnetic material 32, and first nonmagnetic material 33.

Next, the magnetoresistive element 1 of a modification of the first embodiment will be explained.

FIG. 2 is a sectional view of the modification of the magnetoresistive element shown in FIG. 1.

The structure shown in FIG. 2 differs from that shown in FIG. 1 in that an interface layer 11 is inserted between the recording layer 3 and nonmagnetic layer 4. The interface layer 11 is made of a ferromagnetic material, and has an effect of reducing a lattice mismatch in the interface between the storage layer 3 and nonmagnetic layer 4. It is also possible to achieve an effect of obtaining a high tunneling magnetoresistance ratio (TMR ratio) and high spin transfer torque efficiency by using a high-polarization material as the interface layer 11. The properties of the interface layer 11 will be described in detail later.

(2) Fixed Layer

As described above, the fixed layer 2 has the multilayered structure including the magnetic layers 21 and 22 and nonmagnetic layer 23. Also, the magnetic layer 21 has the multilayered structure including the first ferromagnetic material 31, second ferromagnetic material 32, and first nonmagnetic material 33. However, annealing after formation may make the multilayered structures unclear and give each element a concentration gradient.

The magnetic layer 21 has perpendicular magnetic anisotropy. To achieve perpendicular magnetic anisotropy, the first ferromagnetic material 31 is an alloy $(Co_{100-x}—Fe_x)_{100-y}B_y$ containing Co, Fe, and B where $x \geq 50$ at % and $0 < y \leq 30$ at %, and the first nonmagnetic material 33 is an element selected from Zr, Nb, Mo, Hf, Ta, or W, or an alloy mainly containing at least the element.

The results of the examination of a combination of the first ferromagnetic material 31 and first nonmagnetic material 33 and perpendicular magnetic anisotropy will be described below. A first nonmagnetic material (Zr, Nb, Mo, Hf, Ta, or W), first ferromagnetic material (FeCoB), and MgO (3 nm) were sequentially formed on a silicon substrate. Since the degree of mixing with the first ferromagnetic material changes from one nonmagnetic material to another, anisotropy fields (Hk) when the magnetic moment per unit area was about $1 \times 10^{-4}$ emu/cm$^2$ were compared. The anisotropy field was calculated by applying a magnetic field in the in-plane direction of the film, and measuring and evaluating a hysteresis loop on the axis of hard magnetization by using a vibrating sample magnetometer. Consequently, the anisotropy field was 2 kOe for all the nonmagnetic materials, i.e., Zr, Nb, Mo, Hf, Ta, and W, indicating perpendicular magnetic anisotropy. An anisotropy field of 5 kOe or more was obtained for Nb, Mo, Ta, and W.

The second ferromagnetic material 32 desirably contains Co in order to couple with the magnetic layer 22 by exchange coupling via the nonmagnetic layer 23. The nonmagnetic layer desirably contains Ru, and the film thickness is desirably 0.4 (inclusive) to 1.0 (inclusive) nm.

FIG. 3A shows the dependence of an exchange coupling magnetic field on the Ru film thickness of the nonmagnetic layer 23 in a pseudo top-pinned structure in which the first ferromagnetic material 31 was FeCoB (1.1 nm), the first nonmagnetic material 33 was Ta (0.4 nm), the second ferromagnetic material 32 was Co (0.4 nm), and the magnetic layer 22 had a multilayer of [Co (0.3 nm)/Pt (0.6 nm)]×6. Note that each numerical value in the parentheses indicates the film thickness.

No clear antiparallel state was formed when the Ru film thickness was 0.4 (inclusive) to 0.5 (inclusive) nm. A large exchange coupling magnetic field was obtained when the Ru film thickness was 0.6 (inclusive) to 0.7 (inclusive) nm. A maximum exchange coupling magnetic field was obtained when the Ru film thickness was 0.7 nm.

FIG. 4 shows a hysteresis loop (MH loop) when the Ru film thickness was 0.6 nm. The MH loop was measured with a vibrating sample magnetometer. By thus properly selecting particularly the first ferromagnetic material 31 and first nonmagnetic material 33, it is possible to implement a perpendicular magnetization type synthetic anti-ferro structure in which the total film thickness of the fixed layer 2 is very small.

Figure 3B:
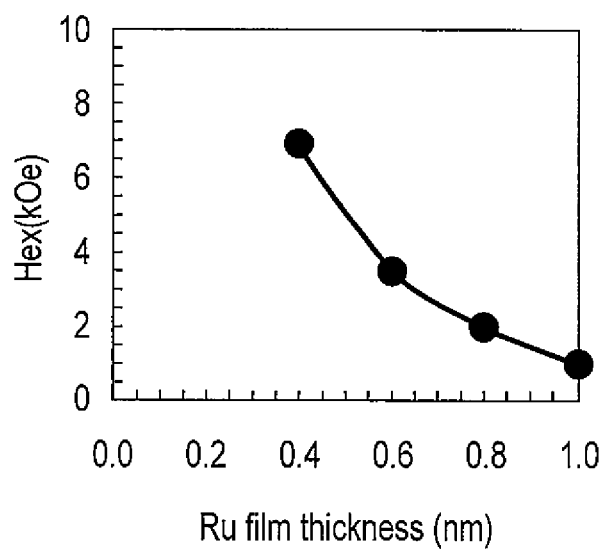

FIG. 3B shows the dependence of an exchange coupling magnetic field on the Ru film thickness in a pseudo top-pinned structure in which the magnetic layer 21 contained FeCoB (1.2 nm), and the magnetic layer 22 had a multilayer of [Co(0.3 nm)/Pt(0.6 nm)]×6. Note that each numerical value in the parentheses indicates the film thickness. Ta was added to give the magnetic layer 21 perpendicular magnetic anisotropy.

A clear antiparallel state was formed and a large exchange coupling magnetic field was obtained from an Ru film thickness of 0.4 nm.

FIG. 5 shows the MH loop of a pseudo bottom-pinned structure in which the first ferromagnetic material 31 was FeCoB (1.4 nm), the first nonmagnetic material 33 was Ta (0.3 nm), the second ferromagnetic material 32 was Co (0.5 nm), and the magnetic layer 22 contained a CoPt alloy (5 nm). Note that each numerical value in the parentheses indicates the film thickness. The film thickness of Ru as the nonmagnetic layer 23 was 1 nm.

FIG. 5 reveals that the magnetization directions in the magnetic layers 21 and 22 were antiparallel. Also, in the top-pinned structure as described above, the exchange coupling magnetic field was maximum when the Ru film thickness was about 0.7 nm. In the bottom-pinned structure, however, the exchange coupling magnetic field was maximum when the Ru film thickness was about 1 nm, unlike in the top-pinned structure. This demonstrates that an optimal Ru film thickness changes in accordance with the structure. That is, the Ru film thickness changes in accordance with the structures of the upper and lower magnetic layers, and perhaps shifts by about 0.3 nm from that in the top-pinned structure. Therefore, it is desirable to appropriately adjust the Ru film thickness within the range of 0.7 (inclusive) to 1.3 (inclusive) nm.

In either the top-pinned structure or the bottom-pinned structure, it is important to use neither Pt nor Pd that readily achieves high perpendicular magnetic anisotropy between the nonmagnetic layers 4 and 23. This makes it possible to achieve both thinning of the fixed layer 2 and a high magnetoresistance ratio (MR ratio).

(3) Storage Layer

When using a perpendicular magnetization film as the storage layer 3 of the magnetoresistive element 1, the element size can be made smaller than that of an in-plane magnetization type element because no shape magnetic anisotropy is used as described previously. In addition, it is possible to form the storage layer 3 by using a material having high perpendicular magnetic anisotropy to achieve both small size and a low switching current while maintaining the thermal stability. Necessary properties of the storage layer and practical examples of material selection will be explained in detail below.

(3-1) Necessary Properties of Storage Layer

When using a perpendicular magnetization material as the storage layer, a thermal stability factor $\Delta$ is represented as in Equation (1) below by using the ratio of an effective anisotropic energy $K_u^{eff} \cdot V$ to a thermal energy $k_B T$.

$$\Delta = K_u^{eff} \cdot V / k_B T \qquad (1)$$
$$= (K_u - 2\pi N M_S^2) \cdot Va / k_B T$$

where
$K_u$: perpendicular magnetic anisotropy energy
$M_S$: saturation magnetization
$N$: demagnetization coefficient
$Va$: magnetization reversal unit volume To avoid the problem (thermal disturbance) that the thermal energy fluctuates magnetization, a thermal stability factor $\Delta$ larger than 60 ($\Delta > 60$) is a necessary condition. If the element size or film thickness is decreased in order to increase the capacity, however, Va decreases, and this may make stored information unable to maintain (=thermal disturbance), and unstable.

Accordingly, it is desirable to select a material having a large perpendicular magnetic anisotropy energy $K_u$ and/or small saturation magnetization $M_S$ as the storage layer.

On the other hand, a critical current $I_C$ required for magnetization reversal by the perpendicular magnetization type spin-transfer-torque writing method is generally expressed as in Equation (2):

$$Ic \propto \alpha/\eta \cdot \Delta \qquad (2)$$

Where

α: magnetic relaxation constant

η: spin transfer torque efficiency coefficient (3-2) Storage Layer Materials

The storage layer material can appropriately be selected from the following materials in consideration of the above-mentioned characteristics.

(3-2-1) Ordered Alloy System

An ordered alloy to be used as the storage layer 3 is an alloy containing one or more elements selected from Fe, Co, and Ni, and one or more elements selected from Pt and Pd, and having an $L1_0$ crystal structure. Examples of the ordered alloy are $Fe_{50}Pt_{50}$, $Fe_{50}Pd_{50}$, $Co_{50}Pt_{50}$, $Fe_{30}Ni_{20}Pt_{50}$, $Co_{30}Fe_{20}Pt_{50}$, and $Co_{30}Ni_{20}Pt_{50}$. These ordered alloys are not limited to the above-mentioned composition ratios.

The effective magnetic anisotropic energy and saturation magnetization can be adjusted by adding, to these ordered alloys, impurity elements such as Cu (copper), Cr (chromium), and Ag (silver) or alloys of these elements, and insulators. When selecting a material having a large lattice mismatch with the nonmagnetic layer 4 as the storage layer 3, the interface layer 11 is preferably inserted between the nonmagnetic layer 4 and storage layer 3 as shown in FIG. 2.

(3-2-2) Multilayer System

A multilayer to be used as the storage layer 3 is a structure obtained by alternately stacking one element selected from Fe, Co, and Ni or an alloy containing one or more of these elements, and one element selected from Cr, Pt, Pd, Ir, Rh, Ru, Os, Re, Au, and Cu or an alloy containing one or more of these elements. Examples are a Co/Pt multilayer, a Co/Pd multilayer, a CoCr/Pt multilayer, a Co/Ru multilayer, Co/Os, Co/Au, and a Ni/Cu multilayer.

The effective magnetic anisotropic energy and saturation magnetization of these multilayers can be adjusted by adding elements to the magnetic layer, and adjusting the film thickness ratio of the magnetic layer to the nonmagnetic layer and the stacking period. The use of these multilayered films as the storage layer 3 is in many cases unfavorable to achieve a high tunneling magnetoresistance ratio (TMR ratio), because the lattice mismatch with the nonmagnetic layer 4 is large. In this case, as shown in FIG. 2, the interface layer is preferably inserted between the nonmagnetic layer 4 and storage layer 3.

(3-2-3) Disordered Alloy System

A disordered alloy to be used as the storage layer 3 is a metal mainly containing cobalt (Co), and containing one or more elements selected from chromium (Cr), tantalum (Ta), niobium (Nb), vanadium (V), tungsten (W), hafnium (Hf), titanium (Ti), zirconium (Zr), platinum (Pt), palladium (Pd), iron (Fe), and nickel (Ni). Examples are a CoCr alloy, CoPt alloy, CoCrPt alloy, CoCrPtTa alloy, and CoCrNb alloy.

The effective magnetic anisotropic energy and saturation magnetization of these alloys can be adjusted by increasing the ratio of the nonmagnetic element. The use of these alloys as the storage layer 3 is in many cases unfavorable to achieve a high tunneling magnetoresistance ratio (TMR ratio), because the lattice mismatch with the nonmagnetic layer 4 is large. In this case, as shown in FIG. 2, the interface layer 11 is preferably inserted between the nonmagnetic layer 4 and storage layer 3.

(4) Underlying Layer

As indicated in the detailed explanation of the storage layer 3 described above, to form a perpendicular magnetization film having the axis of easy magnetization in the direction perpendicular to the film plane, it is necessary to form a structure in which an atomically closed packed surface is readily oriented. That is, the crystal orientation must be controlled to orient the fcc(111) plane and hcp(001) plane, and the selection of an underlying layer material and multilayered arrangement is important for the purpose.

(4-1) Multilayered Arrangement and Materials of Underlying Layer

When forming the storage layer 3 or fixed layer 2 on the underlying layer 5, the underlying layer 5 can be selected as follows in accordance with a material system.

When using a multilayer system such as Co/Pt, Co/Pd, or Co/Ni, an fcc or hcp CoPd alloy or CoPt alloy, or an RE-TM ordered alloy (e.g., Sm—Co) as the underlying layer 5, a metal having an atomically closed packed structure is desirable. Examples of the metal having an atomically closed packed structure are Pt, Pd, Ir, and Ru.

It is also possible to use an alloy containing two metal elements, or three or more metal elements, instead of one metal element. Examples are Pt—Pd and Pt—Ir. Furthermore, it is possible to use, e.g., Pt—Cu, Pd—Cu, Ir—Cu, Pt—Au, Ru—Au, Pt—Al, or Ir—Al as an alloy of the above-described metal and an fcc metal such as Cu, Au, or Al, or to use, e.g., Pt—Re, Pt—Ti, Ru—Re, Ru—Ti, Ru—Zr, or Ru—Hf as an alloy of the above-described metal and an hcp metal such as Re, Ti, Zr, or Hf.

Since the smoothness worsens if the film thickness of the underlying layer 5 is too large, the film thickness range is favorably 30 nm or less. The underlying layer 5 may also have a multilayered structure. The multilayered structure is used in order to adjust the lattice constant by stacking materials having different lattice constants. For example, when the underlying layer 5 has a multilayered structure in which Pt is formed on Ru, the lattice constant of Pt becomes different from that of a bulk under the influence of Ru. As described previously, however, the lattice constant can also be adjusted by using an alloy, so one of Ru and Pt may be omitted.

When the underlying layer has a multilayered structure, it is possible to improve the smoothness or the crystal orientation of the dense-structure metal by using, e.g., Ta or Ti as the lowermost layer. If the film thickness of Ta or Ti as the lowermost layer is too large, the deposition time prolongs, and the productivity decreases. On the other hand, if the film thickness is too small, the above-described orientation controlling effect is lost. Therefore, the film thickness is preferably 1 to 10 nm.

As the $L1_0$ ordered alloys such as FePt and FePd, (100)-oriented fcc metals such as Pt and Pd, bcc metals such as Cr, and compounds having the NaCl structure such as TiN and MgO are desirable.

Also, when using the RE-TM amorphous alloy, the underlying layer may be made of only a material system that also functions as an adhesion layer, such as Ta, because the alloy is amorphous.

(5) Nonmagnetic Layer

An oxide having the NaCl structure is favorable as the material of the nonmagnetic layer 4 of the magnetoresistive element 1. Practical examples are MgO, CaO, SrO, TiO, VO, and NbO. When the magnetization directions in the storage layer 3 and fixed layer 2 are antiparallel, a spin-polarized Δ1 band dominates tunnel conduction, so only majority spin electrons contribute to the conduction. Consequently, the magnetoresistive element 1 decreases the conductivity and increases the resistance value.

By contrast, when the magnetization directions in the storage layer 3 and fixed layer 2 are parallel, a Δ5 band that is not spin-polarized dominates the conduction, so the magnetoresistive element 1 increases the conductivity and decreases the resistance value. Accordingly, the formation of the Δ1 band is important to achieve a high tunneling magnetoresistance ratio (TMR ratio).

To form the Δ1 band, the (100) plane of the nonmagnetic layer 4 made of the oxide having the NaCl structure must well match with the interface between the storage layer 3 and fixed layer 2.

The interface layer 11 can also be inserted in order to further improve the lattice matching in the (100) plane of the nonmagnetic layer 4 made of the oxide layer having the NaCl structure. To form the Δ1 band, it is more preferable to select, as the interface layer 11, a material by which lattice mismatch in the (100) plane of the nonmagnetic layer 4 is 5% or less.

(6) Interface Layer

To increase the tunneling magnetoresistance ratio (TMR ratio), an interface layer may be formed in the interface of the fixed layer (magnetic layer) 2 in contact with the nonmagnetic layer 4 of the magnetoresistive element 1.

The interface layer is preferably made of a high-polarization material, practically, an alloy $(Co_{100-x}-Fe_x)_{100-y}B_y$, containing Co, Fe, and B where x≥20 at % and 0<y≤30 at %.

When using these magnetic materials as the interface layer, lattice mismatch between the fixed layer 2 and nonmagnetic layer 4 is reduced. In addition, the effect of achieving a high tunneling magnetoresistance ratio (TMR ratio) and high spin transfer torque efficiency can be expected because the materials are high-polarization materials.

As has been explained above, this embodiment can provide a magnetoresistive element capable of reducing a strayed magnetic field from the fixed layer, which increases as small size advances, thereby allowing the stable existence of the two magnetization states in the storage layer, i.e., the parallel and antiparallel states. Also, if the film thickness of the shift cancelling layer becomes too large in order to cancel the strayed magnetic field from the fixed layer, the aspect ratio of the magnetoresistive element increases, and this makes the magnetoresistive element difficult to downsize. Since, however, this embodiment can prevent the increase in film thickness of the shift cancelling layer, the aspect ratio of the magnetoresistive element does not increase, and this facilitates small size the magnetoresistive element.

Second Embodiment

A magnetic random access memory (MRAM) of the second embodiment will be explained below with reference to FIGS. 6 and 7. The MRAM of the second embodiment uses the magnetoresistive element of the first embodiment as a memory element.

FIG. 6 is a circuit diagram showing the arrangement of the MRAM of the second embodiment.

As shown in FIG. 6, this MRAM includes a memory cell array 40 including a plurality of memory cells MC arranged in a matrix. In the memory cell array 40, a plurality of bit line pairs BL and /BL run in the column direction, and a plurality of word lines WL run in the row direction.

The memory cells MC are arranged at the intersections of the bit lines BL and word lines WL. Each memory cell MC includes a magnetoresistive element 1, and a selection transistor (e.g., an n-channel MOS transistor) 41. One terminal of the magnetoresistive element 1 is connected to the bit line BL. The other terminal of the magnetoresistive element 1 is connected to the drain terminal of the selection transistor 41. The source terminal of selection transistor 41 is connected to the bit line /BL. The gate terminal of the selection transistor 41 is connected to the word line WL.

A row decoder 42 is connected to the word lines WL. A write circuit 44 and read circuit 45 are connected to the bit line pairs BL and /BL. A column decoder 43 is connected to the write circuit 44 and read circuit 45. The row decoder 42 and column decoder 43 select each memory cell MC.

Data is written in the memory cell MC as follows. First, to select a memory cell MC as a data write target, the word line WL connected to the memory cell MC is activated. This turns on the selection transistor 41.

In this state, a bidirectional write current Iw is supplied to the magnetoresistive element 1 in accordance with write data. More specifically, when supplying the write current Iw to the magnetoresistive element 1 from the left to the right, the write circuit 44 applies a positive voltage to the bit line BL, and the ground voltage to the bit line /BL. When supplying the write current Iw to the magnetoresistive element 1 from the right to the left, the write circuit 44 applies a positive voltage to the bit line /BL, and the ground voltage to the bit line BL. Thus, data "0" or "1" can be written in the memory cell MC.

Next, data read from the memory cell MC is performed as follows. First, the selection transistor 41 of a memory cell MC to be selected is turned on. The read circuit 45 supplies a read current Ir flowing from the right to the left, for example, to the magnetoresistive element 1. That is, the read current Ir is supplied from the bit line /BL to the bit line BL. Based on the read current Ir, the read circuit. 45 detects the resistance value of the magnetoresistive element 1. Then, the read circuit 45 reads out data stored in magnetoresistive element 1 based on the detected resistance value.

The structure of the MRAM of this embodiment will now be explained with reference to FIG. 7. FIG. 7 is a sectional view showing one memory cell MC.

As shown in FIG. 7, the memory cell MC includes the magnetoresistive element (MTJ) 1 and selection transistor 41. An element isolation insulating layer 46 is formed in the surface region of a p-type semiconductor substrate 51. The surface region of the semiconductor substrate 51 in which no element isolation insulating layer 46 is formed is an active area where an element is to be formed. The element isolation insulating layer 46 is formed by, e.g., shallow trench isolation (STI). Silicon oxide or the like is used as the STI.

In the active area of the semiconductor substrate 51, a source region S and drain region D spaced apart from each other are formed. Each of the source region S and drain region D is an $n^+$-type diffusion region formed by heavily doping an $n^+$-type impurity into the semiconductor substrate 51.

A gate insulating film 41A is formed on the semiconductor substrate 51 between the source region S and drain region D. A gate electrode 41B is formed on the gate insulating film 41A. The gate electrode 41B functions as the word line WL. The selection transistor 41 is thus formed on the semiconductor substrate 51.

On the source region S, an interconnect layer 53 is formed on a contact 52. The interconnect layer 53 functions as the bit line /BL. On the drain region D, a lead line 55 is formed on a contact 54.

On the lead line 55, the magnetoresistive element 1 sandwiched between a lower electrode 7 and upper electrode 9 is formed. An interconnect layer 56 is formed on the upper electrode 9. The interconnect layer 56 functions as the bit line BL. Also, the portion between the semiconductor substrate 51 and interconnect layer 56 is filled with an interlayer dielectric layer 57 made of, e.g., silicon oxide.

In the second embodiment as described in detail above, an MRAM can be fabricated by using the magnetoresistive element 1. Note that the magnetoresistive element 1 can also be used as a domain wall displacement type magnetic memory, in addition to a spin transfer torque type magnetic memory.

The MRAM disclosed in the second embodiment is applicable to various apparatuses. Several application examples of the MRAM will be explained below.

(1) Application Example 1

FIG. 8 specifically shows a digital subscriber line (DSL) data path unit of a DSL modem.

This modem includes a programmable digital signal processor (DSP) 100, analog-to-digital (A/D) converter 110, digital-to-analog (D/A) converter 120, transmission driver 130, and receiver amplifier 140.

FIG. 8 shows no bandpass filter. Instead, FIG. 8 shows an MRAM 170 of the second embodiment and an EEPROM (Electrically Erasable and Programmable ROM) 180, as various types of optional memories for holding a line code program (a program to be executed by the DSP to select and operate a modem in accordance with, e.g., subscriber line information to be coded, and transmission conditions (line codes; QAM, CAP, RSK, FM, AM, PAM, and DWMT).

Note that this application example uses the two types of memories, i.e., the MRAM 170 and EEPROM 180 as the memories for holding the line code program, but the EEPROM 180 may also be replaced with an MRAM. That is, MRAMs alone may also be used instead of the two types of memories.

(2) Application Example 2

Figure 9:
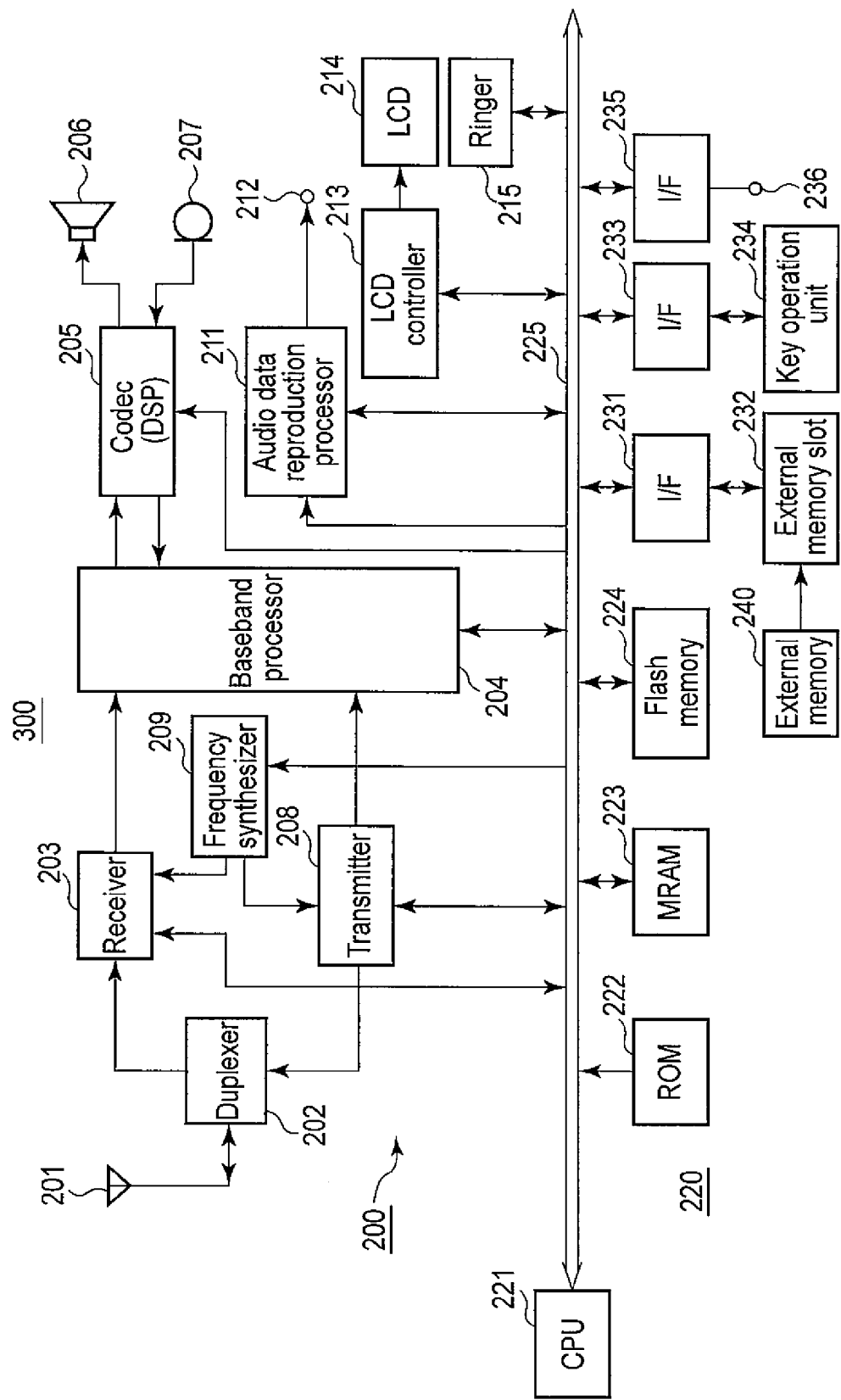
FIG. 9 is a block diagram showing a cell phone terminal as an application example.

FIG. 9 shows a cell phone terminal 300 as another application example.

A communication unit 200 for implementing a communication function includes a transmitting/receiving antenna 201, an antenna duplexer 202, a receiver 203, a baseband processor 204, a DSP 205 to be used as a voice codec, a speaker (receiving apparatus) 206, a microphone (transmitting apparatus) 207, a transmitter 208, and a frequency synthesizer 209.

The cell phone terminal 300 also includes a controller 220 for controlling each unit of the cell phone terminal 300. The controller 220 is a microcomputer formed by connecting a CPU 221, a ROM 222, an MRAM 223 of the second embodiment, and a flash memory 224 via a bus 225.

Programs to be executed by the CPU 221 and necessary data such as display fonts are prestored in the ROM 222.

The MRAM 223 is mainly used as a work area when, e.g., the CPU 221 stores data currently being calculated and the like as needed while executing programs, or temporarily stores data to be exchanged between the controller 220 and each unit.

The flash memory 224 is used to store setting parameters when using a method by which immediately preceding setting conditions and the like are stored when the power supply of the cell phone terminal 300 is turned off, and the same setting conditions are used when the power supply is turned on next time. Accordingly, the stored setting parameters do not disappear when the power supply of the cell phone terminal 300 is turned off.

In addition, the cell phone terminal 300 includes an audio data reproduction processor 211, an external output terminal 212, an LCD controller 213, an LCD (Liquid Crystal Display) 214 for display, and a ringer 215 for generating a ringing tone.

The audio data reproduction processor 211 reproduces audio data input to the cell phone terminal 300 (or audio information (audio data) stored in the external memory 240 (to be described later)). The reproduced audio data (audio information) can be extracted outside by transmitting the data to headphones or portable speakers via the external output terminal 212.

Audio information can be reproduced by using the audio data reproduction processor 211 as described above. The LCD controller 213 receives display information from, e.g., the CPU 221 via the bus 225, converts the received information into LCD control information for controlling the LCD 214, and displays the information by driving the LCD 214.

Furthermore, the cell phone terminal 300 includes interface circuits (I/Fs) 231, 233, and 235, an external memory 240, an external memory slot 232, a key operation unit 234, and an external input/output terminal 236. The external memory 240 such as a memory card is inserted into the external memory slot 232. The external memory slot 232 is connected to the bus 225 via the interface circuit (I/F) 231.

By thus forming the slot 232 in the cell phone terminal 300, internal information of the cell phone terminal 300 can be written in the external memory 240, or information (e.g., audio information) stored in the external memory 240 can be input to the cell phone terminal 300.

The key operation unit 234 is connected to the bus 225 via the interface circuit (I/F) 233. Key input information input from the key operation unit 234 is transmitted to, e.g., the CPU 221. The external input/output terminal 236 is connected to the bus 225 via the interface circuit (I/F) 235. The external input/output terminal 236 functions as a terminal for inputting various kinds of external information to the cell phone terminal 300, or outputting information outside from the cell phone terminal 300.

Note that this application example uses the ROM 222, MRAM 223, and flash memory 224, but it is also possible to replace the flash memory 224 with an MRAM, and further replace the ROM 222 with an MRAM.

(3) Application Example 3

FIGS. 10, 11, 12, 13, and 14 illustrate examples in each of which the MRAM is applied to a card (MRAM card) such as Smart Media for storing media contents.

Figure 10:
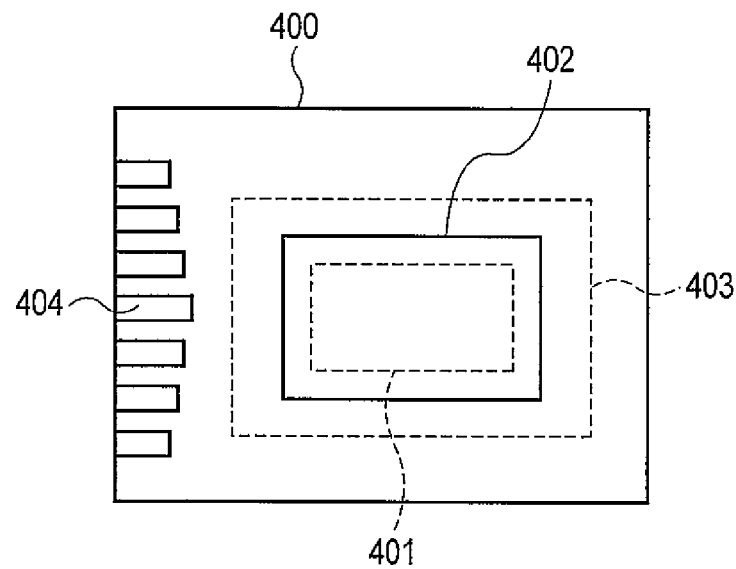
FIG. 10 is a plan view showing an MRAM card as an application example.

As shown in FIG. 10, an MRAM chip 401 is incorporated into an MRAM card main body 400. The card main body 400 has an opening 402 formed in a position corresponding to the MRAM chip 401, thereby exposing the MRAM chip 401. The opening 402 has a shutter 403 that protects the MRAM chip 401 when this MRAM card is carried. The shutter 403 is made of a material, e.g., ceramic, having the effect of blocking an external magnetic field.

When transferring data, the MRAM chip 401 is exposed by opening the shutter 403. An external terminal 404 is used to extract content data stored in the MRAM card outside.

Figure 11:
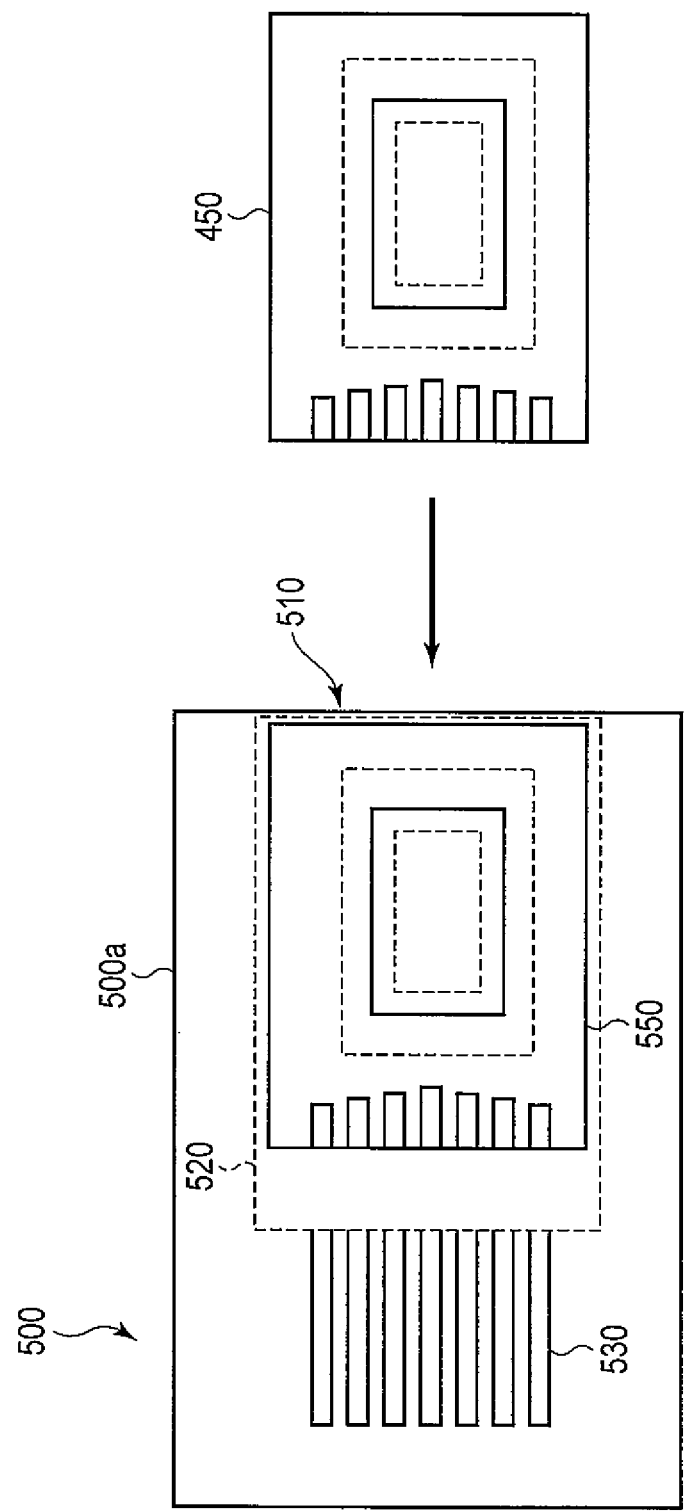
FIG. 11 is a plan view showing a card insertion type transfer apparatus as an application example.
Figure 12:
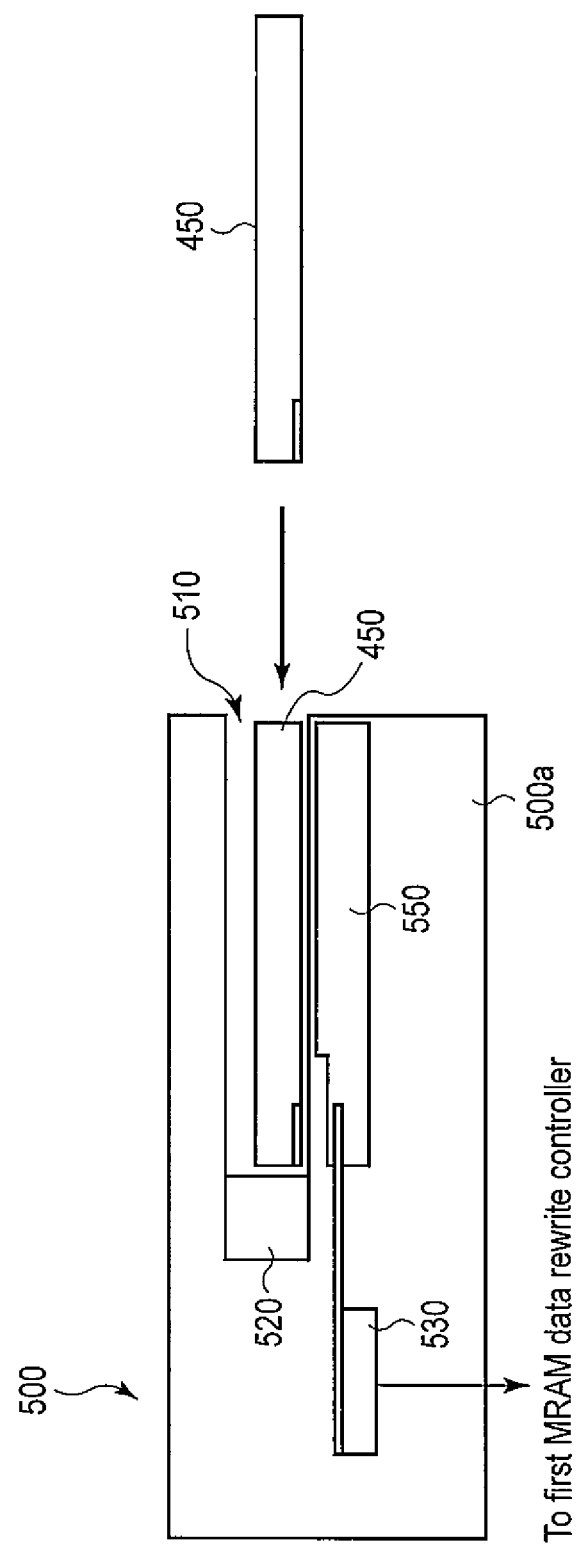
FIG. 12 is a sectional view showing the card insertion type transfer apparatus as an application example.

FIGS. 11 and 12 show a card insertion type transfer apparatus for transferring data to the MRAM card.

A data transfer apparatus 500 includes a container 500*a*. The container 500*a* contains a first MRAM card 550. The container 500*a* includes an external terminal 530 electrically connected to the first MRAM card 550. Data in the first MRAM card 550 is rewritten by using the external terminal 530.

A second MRAM card 450 used by an end user is inserted from an insertion portion 510 of the transfer apparatus 500 as indicated by the arrow, and pushed until it is stopped by a stopper 520. The stopper 520 also functions as a member for aligning the first MRAM 550 and second MRAM card 450. When the second MRAM card 450 is set in a predetermined position, a first MRAM data rewrite controller supplies a control signal to the external terminal 530, and data stored in the first MRAM card 550 is transferred to the second MRAM card 450.

Figure 13:
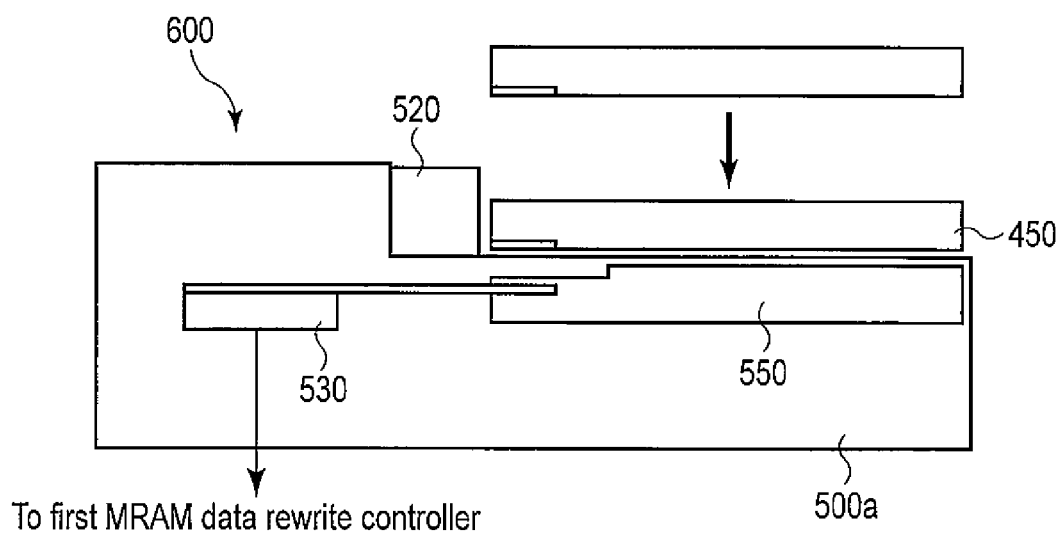
FIG. 13 is a sectional view showing a fitting type transfer apparatus as an application example.

FIG. 13 is a sectional view showing a fitting type transfer apparatus for transferring data to the MRAM card.

In a transfer apparatus 600, the second MRAM card 450 is fitted on the first MRAM 550 as indicated by the arrow by using the stopper 520 as a target. A transfer method is the same as that of the card insertion type apparatus, so a repetitive explanation will be omitted.

FIG. 14 is a sectional view showing a sliding type transfer apparatus for transferring data to the MRAM card.

Like a CD-ROM drive or DVD drive, a receiving slide 560 is formed in a transfer apparatus 700, and moves as indicated by the arrows. When the receiving slide 560 has moved to a position indicated by the broken lines, the second MRAM card 450 is placed on the receiving slide 560, and conveyed into the transfer apparatus 700 as the receiving slide 560 moves.

A transfer method and a feature that the second MRAM card 450 is conveyed such that the distal end portion abuts against the stopper 520 are the same as those of the card insertion type apparatus, so a repetitive explanation will be omitted.

The MRAM explained in the second embodiment can be used for, e.g., a file memory capable of high-speed random write, a portable terminal capable of high-speed download, a portable player capable of high-speed download, a semiconductor memory for a broadcasting apparatus, a drive recorder, a home video system, a large-capacity buffer memory for communication, and a semiconductor memory for a surveillance camera, and has great industrial merits.

As has been explained above, this embodiment can provide a magnetic memory using a magnetoresistive element capable of reducing a strayed magnetic field from the fixed layer, which increases as small size advances, thereby allowing the stable existence of the two magnetization states in the storage layer, i.e., the parallel and antiparallel states.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
a first layer including a first magnetic layer;
a second layer; and
a third layer including a first nonmagnetic layer and provided between the first layer and the second layer,
wherein the second layer includes a second magnetic layer, a third magnetic layer, and a second nonmagnetic layer formed between the second magnetic layer and the third magnetic layer,
the second magnetic layer includes Co and at least one of Zr, Nb, Mo, Hf, Ta, and W, and
the third magnetic layer is thicker than the second magnetic layer.

2. The element according to claim 1, wherein the second magnetic layer includes a first magnetic material, a second magnetic material, and a first nonmagnetic material formed between the first magnetic material and the second magnetic material, and the first magnetic material is in contact with the third layer.

3. The element according to claim 2, wherein the second magnetic material includes Co.

4. The element according to claim 2, wherein the first magnetic material includes Co and Fe.

5. The element according to claim 2, wherein the first magnetic material includes one of a CoFe alloy and an alloy $(Co_{100-x}-Fe_x)_{100-y}B_y$ containing Co, Fe, and B where $x \geq 50$ at % and $0 < y \leq 30$ at %.

6. The element according to claim 2, wherein the first nonmagnetic material includes at least one of Zr, Nb, Mo, Hf, Ta, and W.

7. The element according to claim 1, wherein the second nonmagnetic layer includes Ru.

8. The element according to claim 7, further comprising an underlying layer formed on a surface of the first layer, which is opposite to a surface on which the third layer is formed,
wherein a film thickness of the Ru is 0.4 (inclusive) to 1.0 (inclusive) nm.

9. The element according to claim 7, further comprising an underlying layer formed on a surface of the second layer, which is opposite to a surface on which the third layer is formed,
wherein a film thickness of the Ru is 0.7 (inclusive) to 1.3 (inclusive) nm.

10. The element according to claim 1, wherein the second magnetic layer and the third magnetic layer have antiparallel magnetization directions.

11. The element according to claim 2, wherein the first magnetic material and the second magnetic material have parallel magnetization directions.

12. The element according to claim 1, wherein saturation magnetization and a film thickness of the third magnetic layer are adjusted to cancel a shift of a switching field in the first layer by a strayed magnetic field from the second magnetic layer.

13. The element according to claim 1, further comprising an interface layer formed between the first layer and the third layer and having high polarization.

14. The element according to claim 13, wherein the interface layer includes Co and Fe.

15. The element according to claim 13, wherein the interface layer includes an alloy $(Co_{100-x}-Fe_x)_{100-y}B_y$ containing Co, Fe, and B where $x \geq 20$ at % and $0 < y \leq 30$ at %.

16. The element according to claim 1, further comprising an interface layer formed between the second layer and the third layer and having high polarization.

17. The element according to claim 16, wherein the interface layer includes Co and Fe.

18. The element according to claim 16, wherein the interface layer includes an alloy $(Co_{100-x}-Fe_x)_{100-y}B_y$ containing Co, Fe, and B where $x \geq 20$ at % and $0 < y \leq 30$ at %.

* * * * *